(12) United States Patent
Kamp et al.

(10) Patent No.: US 10,600,648 B2
(45) Date of Patent: Mar. 24, 2020

(54) SILICON-BASED DEPOSITION FOR SEMICONDUCTOR PROCESSING

(71) Applicant: Lam Research Corporation, Fremont, CA (US)

(72) Inventors: Tom A. Kamp, San Jose, CA (US); Mirzafer K. Abatchev, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1 day.

(21) Appl. No.: 15/492,662

(22) Filed: Apr. 20, 2017

(65) Prior Publication Data
US 2018/0308693 A1 Oct. 25, 2018

(51) Int. Cl.
*H01L 21/033* (2006.01)
*H01L 21/02* (2006.01)
(Continued)

(52) U.S. Cl.
CPC ........ *H01L 21/0337* (2013.01); *H01J 37/321* (2013.01); *H01J 37/32183* (2013.01);
(Continued)

(58) Field of Classification Search
CPC ........... H01L 21/02164; H01L 21/0228; C23C 16/45527
See application file for complete search history.

(56) References Cited

U.S. PATENT DOCUMENTS

| | | |
|---|---|---|
| 9,576,811 B2 | 2/2017 | Kanarik et al. |
| 9,583,337 B2 | 2/2017 | Zafiropoulo |
| | (Continued) | |

FOREIGN PATENT DOCUMENTS

| | | |
|---|---|---|
| KR | 10-2009-0068179 | 6/2009 |
| WO | 2011/042882 | 4/2011 |

OTHER PUBLICATIONS

Li et al., "Low Temperature (LT) Thermal ALD Silicon Dioxide Using Ozone Process" AR Radiance, http://www.htlco.co.jp/Low%20Tempreature%20(LT)%20Thermal%20ALD%20Silicon%20Dioxide%20Using%20Ozone%20Process%20.pdf, 2014.
(Continued)

*Primary Examiner* — Charles D Garber
*Assistant Examiner* — Alia Sabur
(74) *Attorney, Agent, or Firm* — Beyer Law Group LLP

(57) ABSTRACT

A method for processing a stack with a carbon based patterned mask is provided. The stack is placed in an etch chamber. A silicon oxide layer is deposited by atomic layer deposition over the carbon based patterned mask by providing a plurality of cycles, wherein each of the cycles of the plurality of cycles, comprises providing a silicon precursor deposition phase, comprising flowing an atomic layer deposition precursor gas into the etch chamber, where the atomic layer deposition precursor gas is deposited while plasmaless and stopping the flow of the atomic layer deposition precursor gas and providing an oxygen deposition phase, comprising flowing ozone gas into the etch chamber, wherein the ozone gas binds with the deposited precursor gas while plasmaless and stopping the flow of ozone gas into the etch chamber. Part of the silicon oxide layer is etched. The stack is removed from the etch chamber.

20 Claims, 7 Drawing Sheets

(51) Int. Cl.
 *H01L 21/311* (2006.01)
 *H01J 37/32* (2006.01)
 *H01L 21/3213* (2006.01)

(52) U.S. Cl.
 CPC .. *H01J 37/32449* (2013.01); *H01J 37/32834* (2013.01); *H01L 21/0228* (2013.01); *H01L 21/02164* (2013.01); *H01L 21/02219* (2013.01); *H01L 21/31116* (2013.01); *H01L 21/31122* (2013.01); *H01L 21/31138* (2013.01); *H01L 21/32137* (2013.01); *H01J 2237/334* (2013.01)

(56) References Cited

U.S. PATENT DOCUMENTS

| | | | | |
|---|---|---|---|---|
| 2007/0065578 | A1* | 3/2007 | McDougall | C23C 16/4404 427/248.1 |
| 2007/0281491 | A1* | 12/2007 | Kamp | H01L 21/31116 438/717 |
| 2010/0178769 | A1* | 7/2010 | Sadjadi | H01L 21/0337 438/694 |
| 2010/0255218 | A1 | 10/2010 | Oka et al. | |
| 2011/0053379 | A1* | 3/2011 | Chi | H01L 21/31116 438/710 |
| 2011/0130011 | A1* | 6/2011 | Sasajima | C23C 16/402 438/770 |
| 2014/0099797 | A1 | 4/2014 | Terasaki | |
| 2015/0001687 | A1 | 1/2015 | Zhang et al. | |
| 2016/0099143 | A1 | 4/2016 | Yan et al. | |
| 2017/0260626 | A1* | 9/2017 | Nagato | C23C 16/401 |

OTHER PUBLICATIONS

O'Neill et al., "Impact of Aminosilane Precursor Structure on Silicon Oxides by Atomic Layer Deposition", The Electrochemical Society Interface, 2011, pp. 33-37.

International Search Report from International Application No. PCT/US2018/020476 dated Nov. 30, 2018.

Written Opinion from International Application No. PCT/US2018/020476 dated Nov. 30, 2018.

* cited by examiner

SILICON-BASED DEPOSITION FOR SEMICONDUCTOR PROCESSING

BACKGROUND

The disclosure relates to a method of forming semiconductor devices on a semiconductor wafer. More specifically, the disclosure relates forming a silicon-based deposition in the formation of semiconductor devices.

In forming semiconductor devices, various layers are deposited.

SUMMARY

To achieve the foregoing and in accordance with the purpose of the present disclosure, a method for processing a stack with a carbon based patterned mask is provided. The stack is placed in an etch chamber. A silicon oxide layer is deposited by atomic layer deposition over the carbon based patterned mask without consuming or attacking the carbon based patterned mask by providing a plurality of cycles, wherein each of the cycles of the plurality of cycles, comprises providing a silicon precursor deposition phase, comprising flowing an atomic layer deposition precursor gas comprising a silicon containing component into the etch chamber, where the atomic layer deposition precursor gas is deposited over the carbon based patterned mask while plasmaless and stopping the flow of the atomic layer deposition precursor gas and providing an oxygen deposition phase, comprising flowing ozone gas into the etch chamber, wherein the ozone gas binds with the deposited precursor gas while plasmaless and stopping the flow of ozone gas into the etch chamber. Part of the silicon oxide layer is etched, comprising flowing a shaping gas comprising a fluorocarbon into the etch chamber, forming the shaping gas into a plasma, which etches the silicon oxide layer, and stopping the flow of the shaping gas. The stack is removed from the etch chamber.

In another manifestation, an apparatus for etching an etch layer in a stack, wherein the etch layer is below a carbon based patterned mask is provided. A processing chamber is provided. A substrate support is within the processing chamber. A gas inlet provides a process gas into the processing chamber. A gas source provides the process gas to the gas inlet, wherein the gas source comprises an ozone source, an atomic layer deposition precursor silicon containing gas source, and a shaping gas source. An exhaust pump pumps gas from the processing chamber. A lower electrode is disposed below the substrate support. An electrode or a coil is within or adjacent to the processing chamber. At least one power source provides power to the lower electrode and the electrode or coil. A controller is controllably connected to the gas source and at least one power source. The controller comprises at least one processor and computer readable media. The computer readable media comprises computer readable code for depositing by atomic layer deposition a silicon oxide layer over the carbon based patterned mask by providing a plurality of cycles, wherein each of the cycles of the plurality of cycles comprises providing a silicon precursor deposition phase comprising flowing an atomic layer deposition precursor gas comprising a silicon containing component into the etch chamber, where the atomic layer deposition precursor gas is deposited over the carbon based patterned mask while plasmaless and stopping the flow of the atomic layer deposition precursor gas and providing an oxygen deposition phase comprising flowing ozone gas into the etch chamber, wherein the ozone gas binds with the deposited precursor gas, while plasmaless and stopping the flow of ozone gas into the etch chamber, computer readable code for etching the silicon oxide layer comprising flowing a shaping gas comprising a fluorocarbon into the etch chamber and forming the shaping gas into a plasma, which etches the silicon oxide layer.

These and other features of the present disclosure will be described in more detail below in the detailed description of embodiments and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present embodiments will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
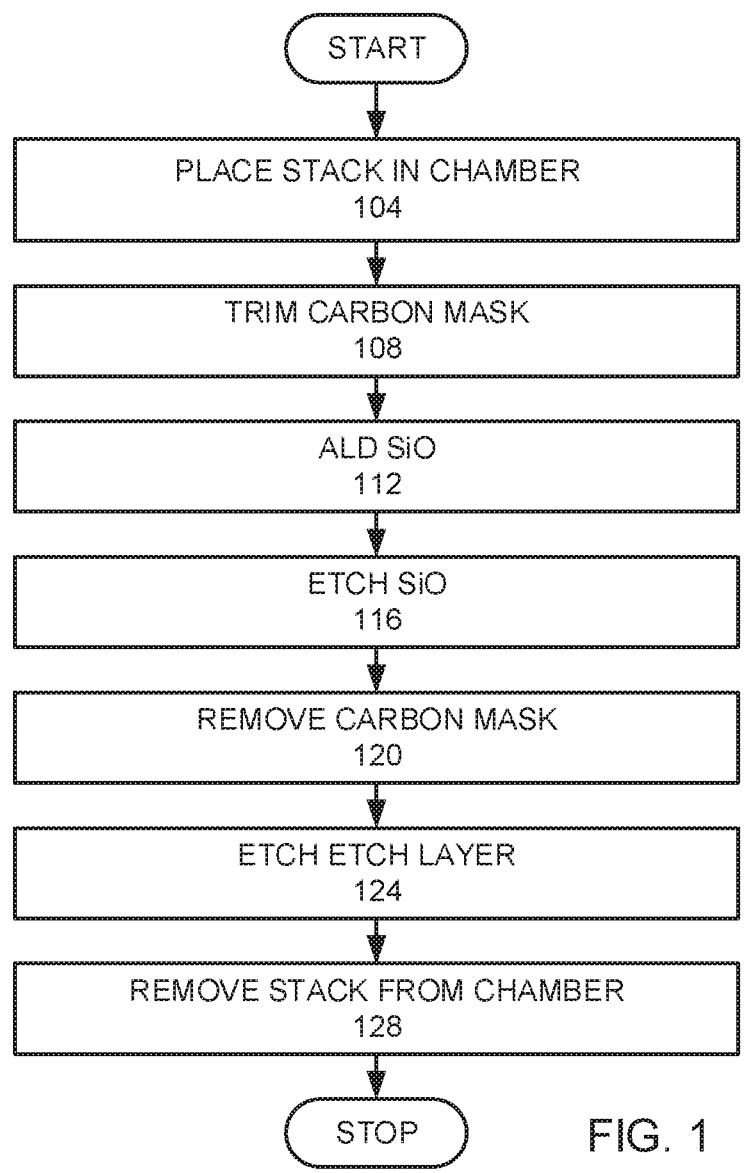
FIG. 1 is a high level flow chart of an embodiment.

FIG. 1 is a high level flow chart of an embodiment. In this embodiment, a stack is placed in a process chamber (step 104). A carbon mask of the stack is trimmed and BARC is etched (step 108). A silicon oxide based layer is deposited over the carbon mask through atomic layer deposition (ALD) (step 112). The silicon oxide based layer is etched (step 116). The carbon mask and BARC are removed (step 120). An etch layer below the silicon oxide based layer is etched (step 124). The stack is removed from the process chamber (step 128).

Example

Figure 2A:
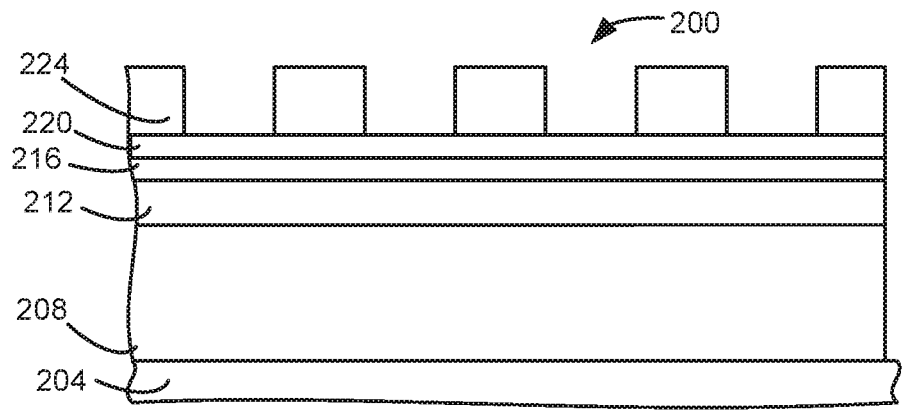
FIGS. 2A-F are schematic cross-sectional views of a stack processed according to an embodiment.

In a preferred embodiment, a stack is placed in a process chamber (step 104). FIG. 2A is a schematic cross-sectional view of a stack 200 on a substrate 204. The substrate 204 is under an etch layer 208, which is under an amorphous carbon layer 212, which is under a hardmask layer 216, which in this example is silicon, which is under a BARC layer 220, which is under a patterned carbon based mask layer 224. In this example, the carbon based mask layer 224 is photoresist. In other embodiments, different, additional, or less layers may be between the layers of the stack 200. In addition, various layers, such as the etch layer 208 may be made of multiple layers, such as a carbon mask layer over a silicon based layer.

Figure 3:
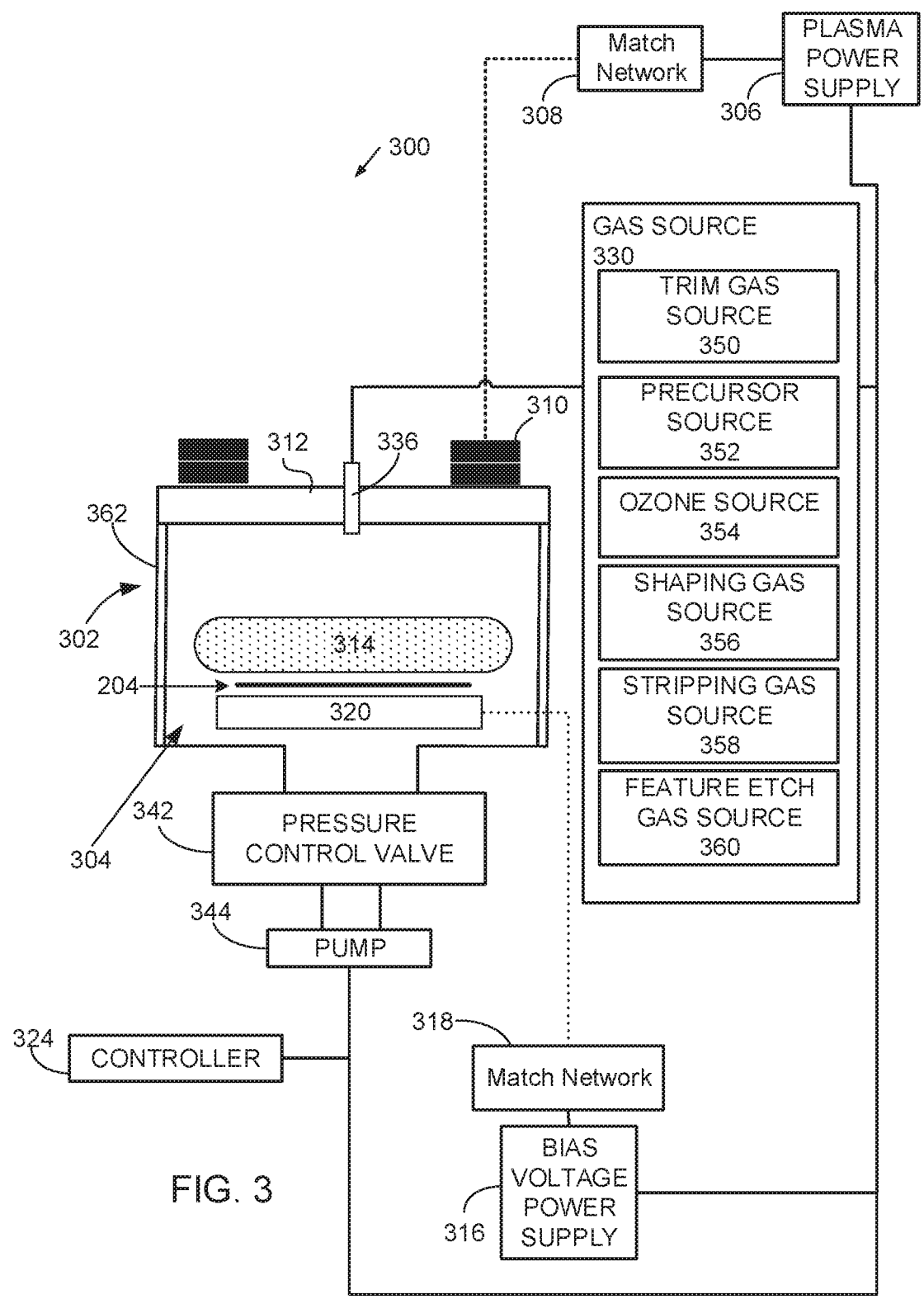
FIG. 3 is a schematic view of a etch chamber that may be used in an embodiment.

FIG. 3 schematically illustrates an example of a plasma processing system 300 which may be used to process the stack 200 in accordance with one embodiment of the present invention. The plasma processing system 300 includes a plasma reactor 302 having a plasma processing chamber 304, enclosed by a chamber wall 362. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the substrate 204 which is supported over the electrode 320. A controller 324 sets points for the plasma power supply 306 and the wafer bias voltage power supply 316.

The plasma power supply 306 and the wafer bias voltage power supply 316 may be configured to operate at specific radio frequencies such as, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. In this embodiment, the gas source 330 comprises a trim gas source 350, a silicon precursor source 352, an ozone gas source 354, a shaping gas source 356, a stripping gas source 358, and a feature etch gas source 360. The gas source/gas supply mechanism 330 provides gas to a gas feed 336 in the form of a nozzle. The process gases and byproducts are removed from the plasma processing chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. of Fremont, Calif., may be used to practice an embodiment of the invention.

Figure 4:
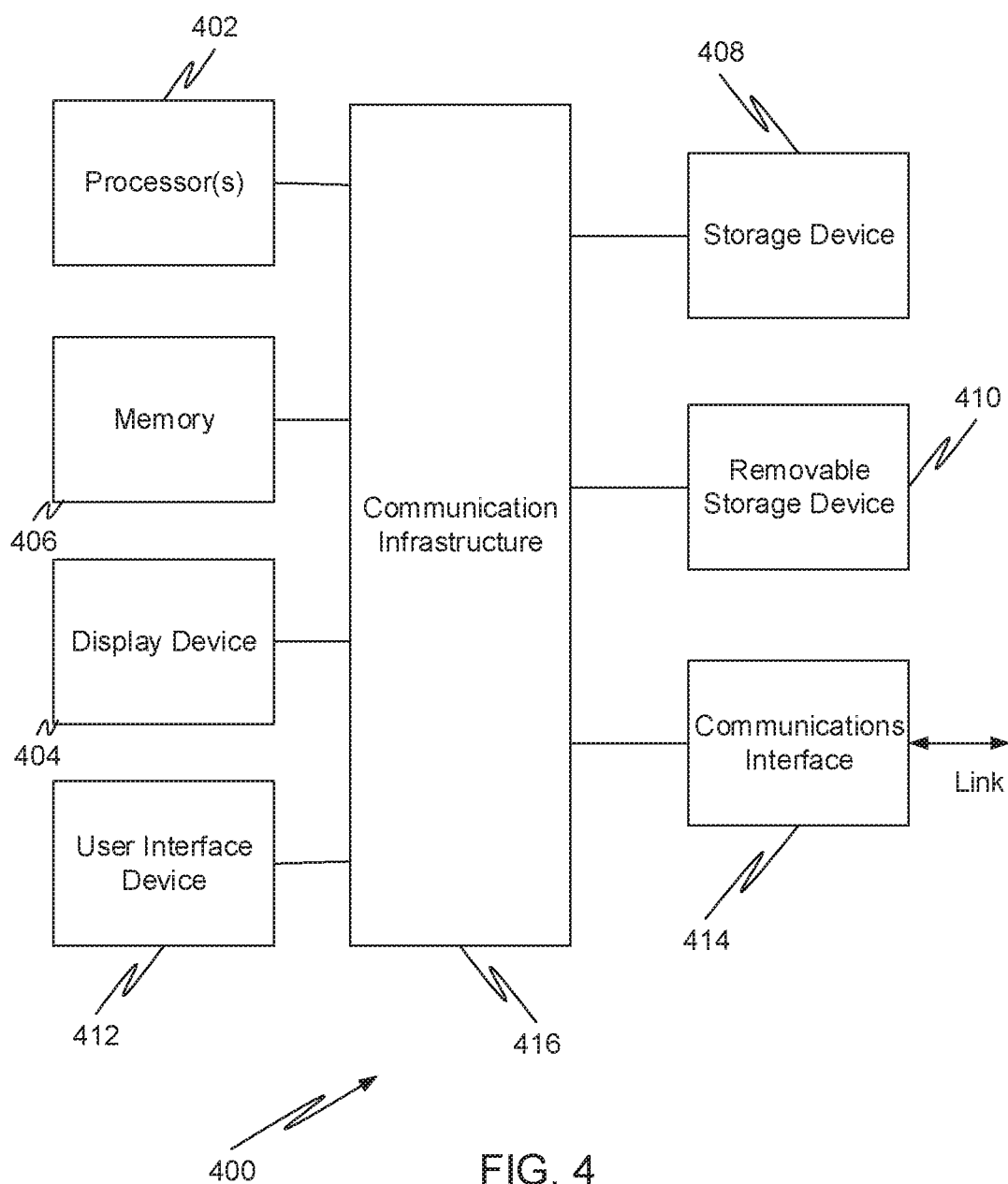
FIG. 4 is a schematic view of a computer system that may be used in practicing an embodiment.

FIG. 4 is a high level block diagram showing a computer system 400, which is suitable for implementing a controller 324 used in embodiments. The computer system may have many physical forms, ranging from an integrated circuit, a printed circuit board, and a small handheld device, up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory, and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
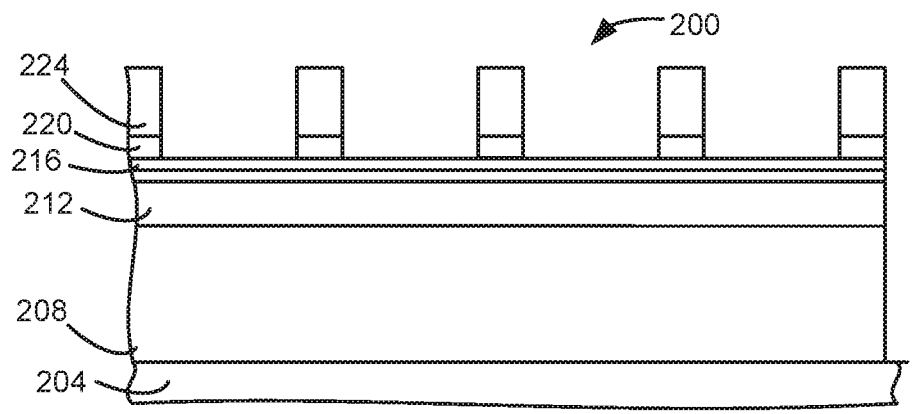

After the stack 200 has been placed into the plasma processing system 300, the carbon based mask layer 224 is trimmed and BARC layer etched (step 108). In this example, a trim gas comprising 50 sccm $N_2$, 15 sccm $O_2$, and 150 sccm He is flowed into the plasma processing chamber, providing a pressure of 5 mTorr. The plasma power supply 306 provides 900 Watts of TCP power. The BARC layer 220 can be etched either before or after trimming step. An example of a BARC etch flows a BARC etch gas of 15 sccm $O_2$, 5 sccm $CH_4$, and 50 sscm $Cl_2$ into the plasma processing chamber 304 at a pressure of 8 mTorr. The plasma power supply 306 provides 400 Watt TCP power. A 60 V bias voltage is provided. FIG. 2B is a cross-sectional view of the stack 200 after the carbon based mask layer 224 is trimmed and the BARC layer 220 is etched.

Figure 2C:
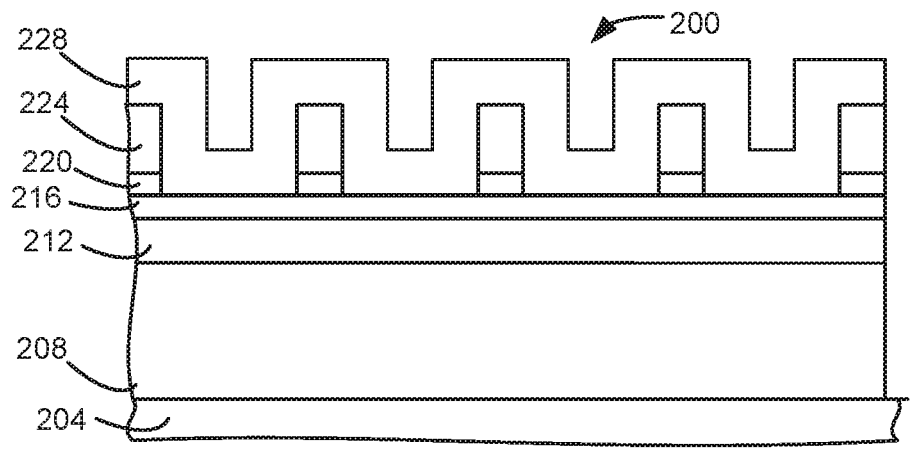
Figure 5:
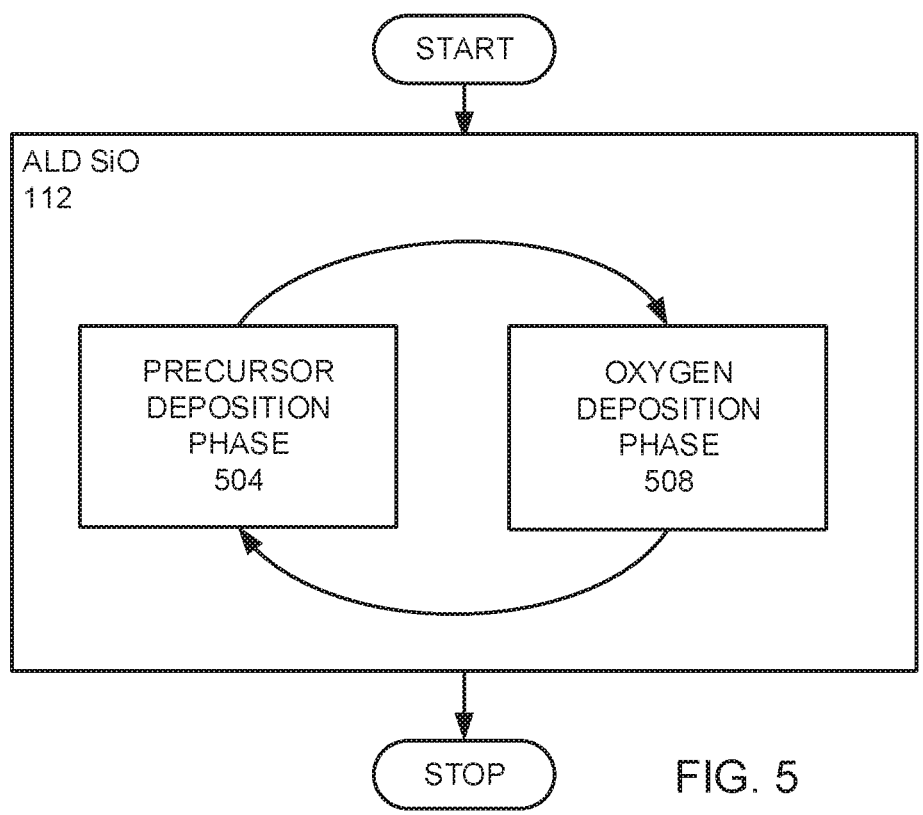
FIG. 5 is a detailed flow chart of a deposition layer formation step.
Figure 6:
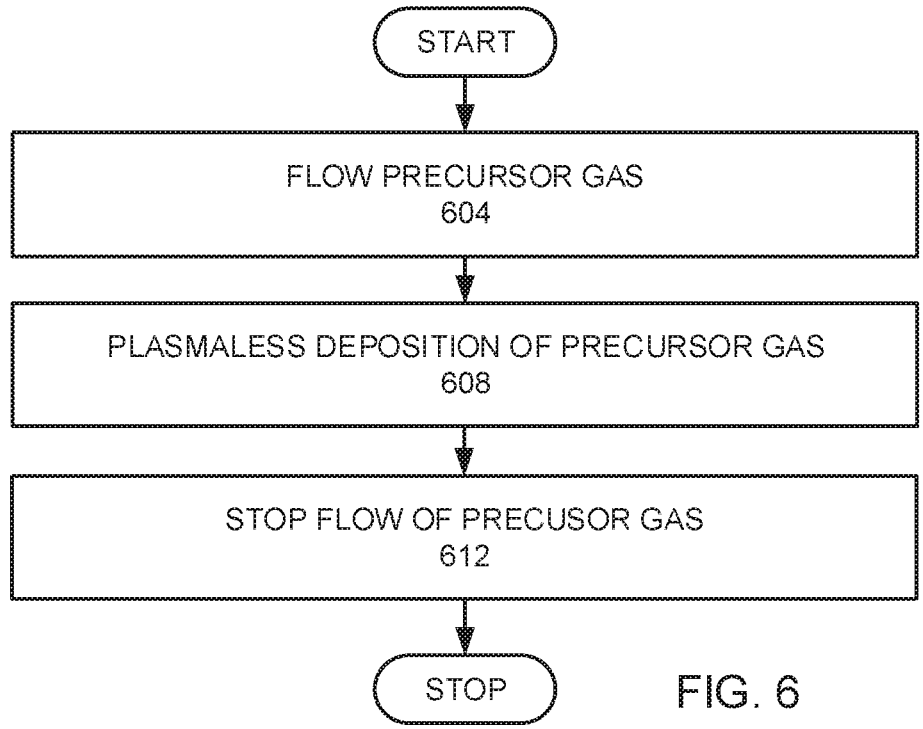
FIG. 6 is a more detailed flow chart of the precursor deposition phase.
Figure 7:
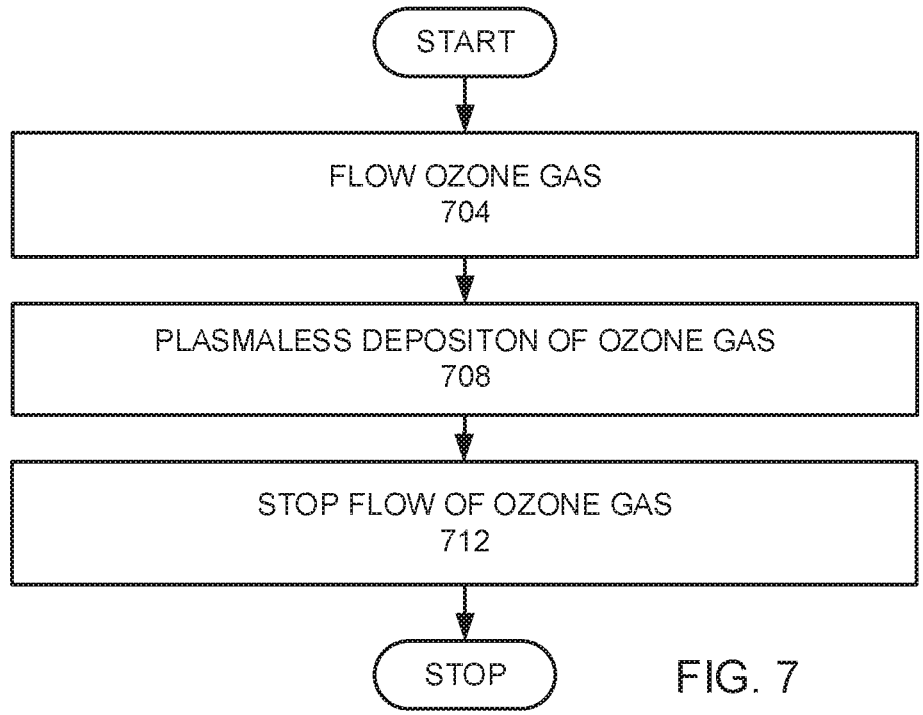
FIG. 7 is a more detailed flow chart of the oxygen deposition phase.

A silicon oxide based layer is deposited using atomic layer deposition (step 112). FIG. 5 is a more detailed flow chart of the atomic layer deposition (step 112). The atomic layer deposition (step 112) comprises a plurality of cycles, wherein each cycle comprises a silicon precursor deposition (adsorption) phase (step 504) and an oxygen deposition (precursor oxidizing) phase (step 508). FIG. 6 is a more detailed flow chart of the precursor deposition phase (step 504). A silicon containing precursor was introduced by vapor drawn from vessel sustained at certain temperature to insure consistent flow into the plasma processing chamber 304 (step 604). In this example, the silicon containing precursor gas is aminosilane BTBAS (bis(tertiarybutylamino)silane). Other precursors can work as well, such as $H_2Si[N(C_2H_5)_2]_2$ (SAM24). The silicon containing precursor is deposited on the stack while plasmaless (step 608). After 4 seconds the flow of the silicon containing precursor is stopped (step 612). FIG. 7 is a more detailed flow chart of the oxygen deposition ($SiO_2$ forming) phase (step 508). Ozone gas is flowed into the plasma processing chamber 304 (step 704). In this example, >50 sccm of $O_3$ is flowed into the processing chamber 304. The pressure is maintained at >100 mTorr. The ozone gas is deposited on the stack while plasmaless (step 708). After 2 seconds the flow of ozone is stopped (step 712). FIG. 2C is a cross-sectional view of the stack 200 after the silicon oxide based layer 228 is deposited by atomic layer deposition after specific number of cycles to achieve a target thickness of ALD Oxide.

Figure 2D:
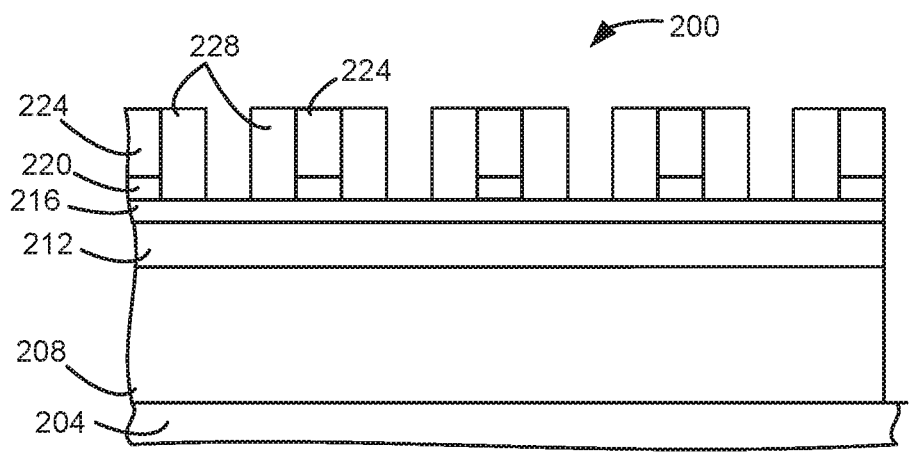
Figure 8:
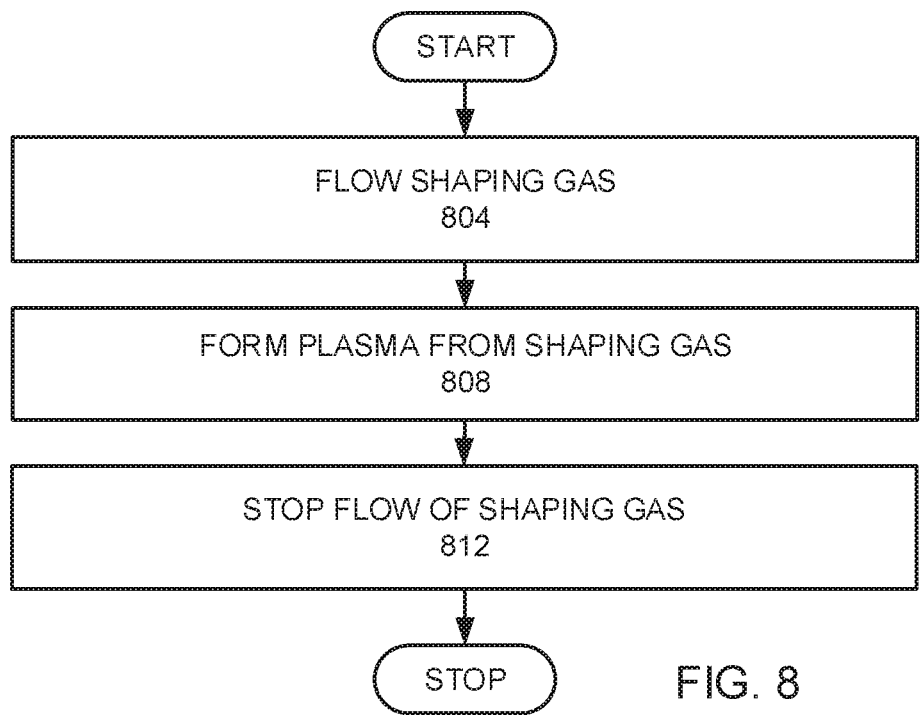
FIG. 8 is a more detailed flow chart of the step of partially etching the silicon oxide based layer.

The silicon oxide based layer 228 is partially etched or shaped (step 116). FIG. 8 is a more detailed flow chart of the step of partially etching the silicon oxide based layer 228. A shaping gas is flowed into the plasma processing chamber 304 (step 804). In this example, the shaping gas comprises 100 sccm of CF4, 50 sccm of CHF3 and 9 sccm of O2 is flowed into the processing chamber 304. The pressure is maintained at 5 mTorr. A plasma is formed from the shaping gas (step 808). To form the shaping gas into a plasma, 600 Watts of TCP RF power is provided at 13.56 MHz. A Bias Voltage was sustained at 60 V. After removing SiO2 from the top of the carbon line and horizontal portion of SiO2 layer at the space area the flow of the shaping gas is stopped (step 812). FIG. 2D is a cross-sectional view of the stack 200 after silicon oxide based layer 228 has been etched or shaped (step 116). Horizontal surfaces of the silicon oxide based layer 228 are etched away so that the carbon based mask layer 224 is exposed, as shown. The remaining silicon oxide based layer 228 forms sidewall spacers on sides of the carbon based mask layer 224.

Figure 2E:
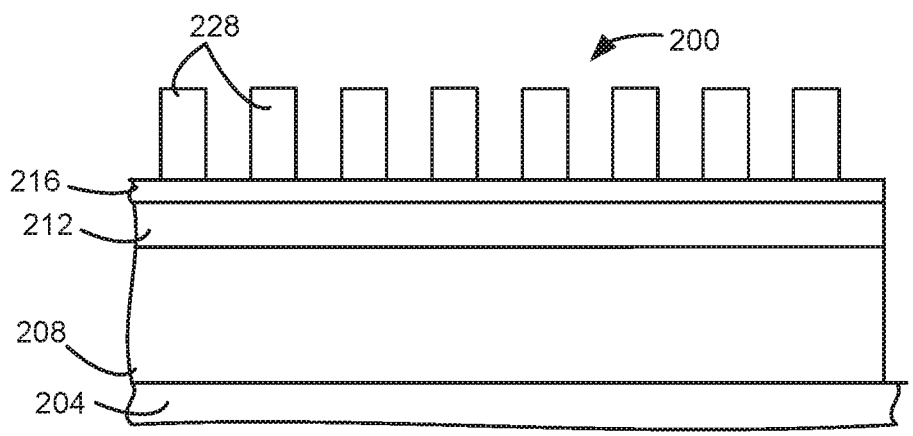

The carbon mask is removed or stripped (step 120). In this example, process conditions provide a mask stripping gas of 150 sccm $O_2$ and 150 sccm Ar at a chamber pressure of 10 mTorr. The mask stripping gas is formed into a plasma by providing 600 Watt TCP power. FIG. 2E is a cross-sectional view of the stack 200 after the carbon based mask layer is removed. In this embodiment, the stripping of the carbon mask layer also removes the remaining BARC layer. The remaining silicon oxide based layer 228 provides a pattern with twice the density of the carbon mask.

Figure 2F:
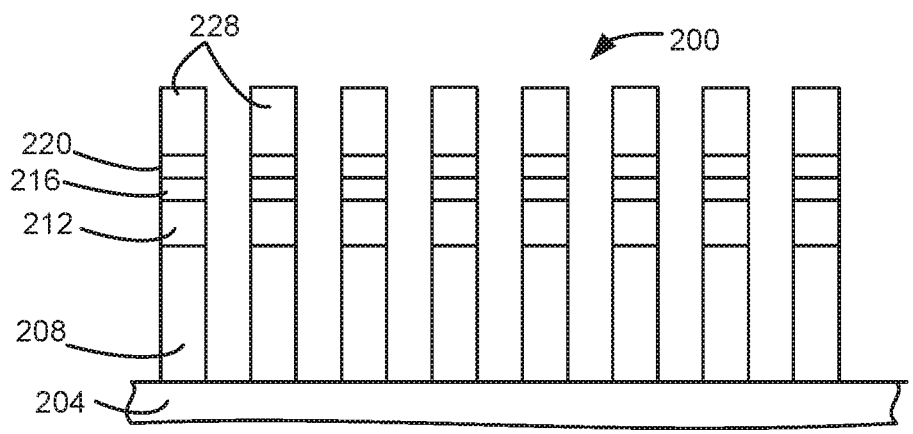

The amorphous carbon layer 212 and hardmask layer 216 may be etched in-situ after carbon mask strip. An example of a Si (layer 216) etch process provides an Si etch gas of 50 sccm CF4 and 50 sccm Ar at a pressure of 5 mTorr. The Si etch gas is formed into a plasma by providing 500 Watt TCP power with a 100 V bias voltage. An example of a process for etching a-C (layer 212) provides an amorphous carbon etch gas of 80 sccm SO2 and 90 sccm O2 at a pressure of 8 mTorr. The amorphous carbon etch gas is formed into a plasma by providing 800 Watt TCP power, 350 V bias voltage. A recipe for etching an etch layer 208 of (Si film in this example): 500 sccm HBr, 500 sccm He, 15 sccm O2 at pressure of 25 mTorr, 350 Watt TCP power and a 300 V bias voltage. The etch layer 208 is etched (step 124). FIG. 2F is a cross-sectional view of the stack 200 after the etch layer is etched.

The resulting stack has features etched in the etch layer 208 with twice the density as the original pattern of the carbon based mask layer. The method and apparatus allows for ALD and etching for both feature doubling and etching to occur in the same processing chamber on the same chuck without moving the stack.

Generally, a fluorocarbon gas, such as $CF_4$, may be used for partially etching the silicon oxide base layer. In various embodiments, the carbon based layer may be amorphous carbon, organic material, or photoresist.

In various embodiments, the etch layer 208 may comprise a plurality of layers, including another carbon based layer. The silicon oxide based layer 228 may be used as a mask for etching the carbon based layer. The silicon oxide based layer 228 may be removed and another silicon oxide based layer may be provided by ALD. The silicon oxide layer may be partially etched and the carbon based layer removed providing a patterned mask with four times the density as the original pattern. Such subsequent ALD processes may use a plasma for ALD. The apparatus is able to provide a plasmaless ALD and ALD with plasma.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for processing a stack with a carbon based patterned mask in-situ, comprising:
    placing the stack in an etch chamber;
    depositing by atomic layer deposition a silicon oxide layer over the carbon based patterned mask without consuming or attacking the carbon based patterned mask by providing a plurality of cycles, wherein each of the plurality of cycles comprises:
        providing a silicon precursor deposition phase, comprising:
            flowing an atomic layer deposition precursor gas comprising a silicon containing component into the etch chamber, where the atomic layer deposition precursor gas is deposited over the carbon based patterned mask, while plasmaless; and
            stopping the flow of the atomic layer deposition precursor gas; and
        providing an oxygen deposition phase, comprising:
            flowing only an oxygen deposition gas consisting essentially of ozone gas into the etch chamber, wherein the ozone gas binds with the deposited precursor gas, while plasmaless; and
            stopping the flow of the oxygen deposition gas into the etch chamber;
    etching part of the silicon oxide layer, comprising:
        flowing a shaping gas comprising a fluorocarbon into the etch chamber;
        forming the shaping gas into a plasma, which etches the silicon oxide layer; and
        stopping the flow of the shaping gas; and
    removing the stack from the etch chamber.

2. The method, as recited in claim 1, further comprising trimming the carbon based patterned mask after placing the stack in the etch chamber and before depositing the silicon oxide layer over the carbon based patterned mask.

3. The method, as recited in claim 2, further comprising:
    stripping the carbon based patterned mask after etching the silicon oxide layer; and
    etching an etch layer below the silicon oxide layer after stripping the carbon based patterned mask and before removing the stack from the etch chamber.

4. The method, as recited in claim 3, wherein the carbon based patterned mask comprises at least one of amorphous carbon, organic material, or photoresist.

5. The method, as recited in claim 4, wherein a BARC layer is below the carbon based patterned mask, further comprising etching the BARC layer before depositing the silicon oxide layer over the carbon based patterned mask.

6. The method, as recited in claim 5, wherein the silicon containing component of the atomic layer deposition precursor gas is aminosilane BTBAS (bis(tertiarybutylamino)silane) or $H_2Si[N(C_2H_5)_2]_2$.

7. The method, as recited in claim 6, wherein the flowing of the ozone gas into the etch chamber provides a pressure of greater than 100 mTorr.

8. The method, as recited in claim 1, further comprising:
 stripping the carbon based patterned mask after etching the silicon oxide layer; and
 etching an etch layer below the silicon oxide layer after stripping the carbon based patterned mask and before removing the stack from the etch chamber.

9. The method, as recited in claim 1, wherein the carbon based patterned mask comprises at least one of amorphous carbon, organic material, or photoresist.

10. The method, as recited in claim 1, wherein a BARC layer is below the carbon based patterned mask, further comprising etching the BARC layer before depositing the silicon oxide layer over the carbon based patterned mask.

11. The method, as recited in claim 1, wherein the silicon containing component of the atomic layer deposition precursor gas is aminosilane BTBAS (bis(tertiarybutylamino)silane) or $H_2Si[N(C_2H_5)_2]_2$.

12. The method, as recited in claim 1, wherein the flowing of the ozone gas into the etch chamber provides a pressure of greater than 100 mTorr.

13. The method, as recited in claim 1, wherein the carbon based patterned mask comprises photoresist.

14. An apparatus for etching an etch layer in a stack in-situ, wherein the etch layer is below a carbon based patterned mask, comprising a processing chamber;
 a substrate support within the processing chamber;
 a gas inlet for providing a process gas into the processing chamber;
 a gas source for providing the process gas to the gas inlet, wherein the gas source comprises:
  an ozone source;
  an atomic layer deposition precursor silicon containing gas source; and
  a shaping gas source;
 an exhaust pump for pumping gas from the processing chamber;
 a lower electrode;
 an electrode or a coil;
 at least one power source for providing power to the lower electrode and the electrode or coil; and
 a controller controllably connected to the gas source and the at least one power source, wherein the controller comprises:
  at least one processor; and
  computer readable media, comprising:
   computer readable code for depositing by atomic layer deposition a silicon oxide layer over the carbon based patterned mask by providing a plurality of cycles, wherein each of the plurality of cycles comprises:
    providing a silicon precursor deposition phase, comprising:
     flowing an atomic layer deposition precursor gas comprising a silicon containing component into the etch chamber, where the atomic layer deposition precursor gas is deposited over the carbon based patterned mask, while plasmaless; and
     stopping the flow of the atomic layer deposition precursor gas; and
    providing an oxygen deposition phase, comprising:
     flowing only an oxygen deposition gas consisting essentially of ozone gas into the etch chamber, wherein the ozone gas binds with the deposited precursor gas, while plasmaless; and
     stopping the flow of the oxygen deposition gas into the etch chamber; and
   computer readable code for etching the silicon oxide layer, comprising:
    flowing a shaping gas comprising a fluorocarbon into the etch chamber; and
    forming the shaping gas into a plasma, which etches the silicon oxide layer.

15. The apparatus, as recited in claim 14, wherein the gas source, further comprises:
 a trim gas source;
 a stripping gas source; and
 a feature etch gas source.

16. The apparatus, as recited in claim 15, wherein the computer readable media further comprises:
 computer readable code for trimming the carbon based patterned mask before depositing the atomic layer deposition, comprising:
  computer readable code for flowing trimming gas from the trimming gas source into the processing chamber;
  computer readable code for providing power to the electrode or coil, which transforms the trimming gas into a plasma, causing the trimming of the carbon based patterned mask; and
  computer readable code for stopping the flow of the trimming gas; and
 computer readable code for stripping the carbon based patterned mask after etching the silicon oxide layer, comprising:
  computer readable code for flowing stripping gas from the stripping gas source into the etch chamber;
  computer readable code for providing power to the electrode or coil, which transforms the stripping gas into a plasma, causing the stripping of the carbon based mask; and
  computer readable code for stopping the flow of the stripping gas; and
 computer readable code for etching the etch layer after stripping the carbon based patterned mask, comprising:
  computer readable code for flowing a feature etch gas from the feature etch gas source into the processing chamber;
  computer readable code for providing power to the electrode or coil, which transforms the feature etch gas into a plasma, causing the etching of the etch layer; and
  computer readable code for stopping the flow of the feature etch gas.

17. The apparatus, as recited in claim 16, wherein the atomic layer deposition precursor silicon containing gas source provides either aminosilane BTBAS (bis(tertiarybutylamino)silane) or $H_2Si[N(C_2H_3)_2]_2$.

18. The apparatus, as recited in claim 17, wherein a BARC layer is below the carbon based patterned mask, further comprising computer readable code for etching the BARC layer before depositing the silicon oxide layer over the carbon based patterned mask.

19. The method, as recited in claim 5, wherein the silicon containing component of the atomic layer deposition precursor gas is $H_2Si[N(C_2H_5)_2]_2$.

20. The apparatus, as recited in claim 16, wherein the atomic layer deposition precursor silicon containing gas source provides $H_2Si[N(C_2H_5)_2]_2$.

\* \* \* \* \*